United States Patent
Uno et al.

(10) Patent No.: US 10,325,903 B2
(45) Date of Patent: Jun. 18, 2019

(54) SEMICONDUCTOR DEVICE

(71) Applicant: MURATA MANUFACTURING CO., LTD., Kyoto-fu (JP)

(72) Inventors: Satoshi Uno, Nagaokakyo (JP); Hiroshi Kawaguchi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 12 days.

(21) Appl. No.: 15/420,533

(22) Filed: Jan. 31, 2017

(65) Prior Publication Data

US 2017/0141099 A1    May 18, 2017

Related U.S. Application Data

(63) Continuation of application No. PCT/JP2015/066739, filed on Jun. 10, 2015.

(30) Foreign Application Priority Data

Sep. 22, 2014  (JP) .................................. 2014-192664

(51) Int. Cl.
| | |
|---|---|
| H01L 27/02 | (2006.01) |
| H01L 21/822 | (2006.01) |
| H01L 21/8222 | (2006.01) |
| H01L 27/04 | (2006.01) |
| H01L 27/06 | (2006.01) |
| H01L 27/08 | (2006.01) |
| H01L 29/861 | (2006.01) |
| H01L 29/20 | (2006.01) |

(52) U.S. Cl.
CPC ........ H01L 27/0255 (2013.01); H01L 21/822 (2013.01); H01L 21/8222 (2013.01);
(Continued)

(58) Field of Classification Search
CPC ............. H01L 27/0255; H01L 27/0292; H01L 27/0207; H01L 29/8613; H01L 27/0814
See application file for complete search history.

(56) References Cited

U.S. PATENT DOCUMENTS

| | | | |
|---|---|---|---|
| 6,636,118 B1 | 10/2003 | Kusano et al. | |
| 2007/0138500 A1* | 6/2007 | Sakai | ...................... H01L 33/38 |
| | | | 257/103 |

FOREIGN PATENT DOCUMENTS

| | | |
|---|---|---|
| CN | 102545180 A | 7/2012 |
| JP | H04-99932 A | 3/1992 |

(Continued)

OTHER PUBLICATIONS

International Search Report issued in PCT/JP2015/066739; dated Sep. 8, 2015.
(Continued)

*Primary Examiner* — Mohammed R Alam
(74) *Attorney, Agent, or Firm* — Studebaker & Brackett PC

(57) ABSTRACT

Connection patterns of plural diodes include a first series connection pattern and a second series connection pattern. The first series connection pattern extends from an input terminal in the X direction. The second series connection pattern has a portion through which a current flows to approach the input terminal. The first series connection pattern includes a first diode, which is the first diode counted from the input terminal. The second series connection pattern includes a second diode, which is the last diode counted from the input terminal. The second diode is disposed separately from the first diode with some distance therebetween in the Y direction. An N-type region of the first diode and a P-type region of the second diode directly oppose each other as viewed in a planar direction.

8 Claims, 10 Drawing Sheets

(52) U.S. Cl.
CPC ...... *H01L 27/0207* (2013.01); *H01L 27/0248* (2013.01); *H01L 27/0292* (2013.01); *H01L 27/04* (2013.01); *H01L 27/06* (2013.01); *H01L 27/0814* (2013.01); *H01L 29/8613* (2013.01); *H01L 29/20* (2013.01); *H01L 29/861* (2013.01)

(56) References Cited

FOREIGN PATENT DOCUMENTS

| | | |
|---|---|---|
| JP | 2002-217374 A | 8/2002 |
| JP | 2005-236259 A | 9/2005 |
| JP | 2007-053216 A | 3/2007 |
| JP | 2007-059882 A | 3/2007 |
| JP | 2008-177466 A | 7/2008 |
| WO | 01/18865 A1 | 3/2001 |

OTHER PUBLICATIONS

Written Opinion issued in PCT/JP2015/066739; dated Sep. 8, 2015.
International Preliminary Report on Patentability issued in PCT/JP2015/066739; dated Mar. 28, 2017.
An Office Action issued by the Taiwanese Patent Office dated May 4, 2017, which corresponds to Taiwanese Patent Application No. 104119228 and is related to U.S. Appl. No. 15/420,533; with English language translation.

* cited by examiner

FIG.19  -Prior Art-
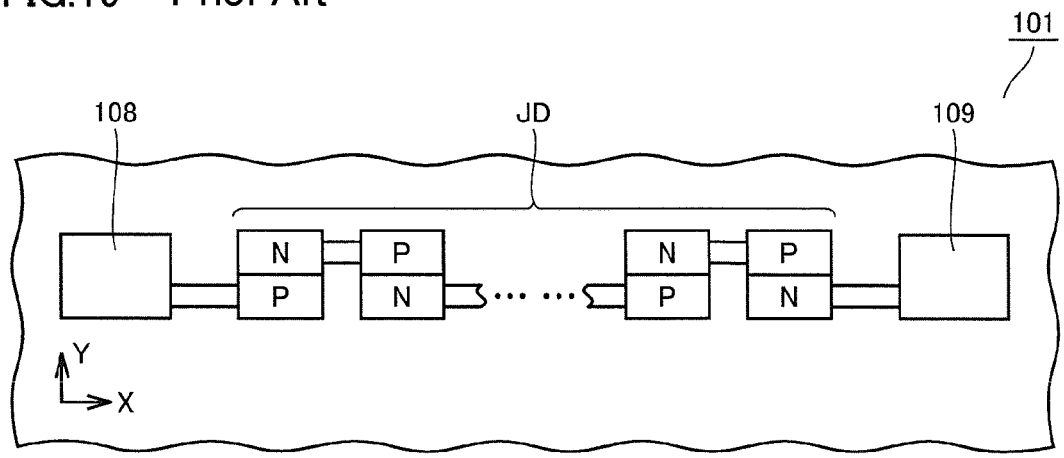
FIG.20  -Prior Art-
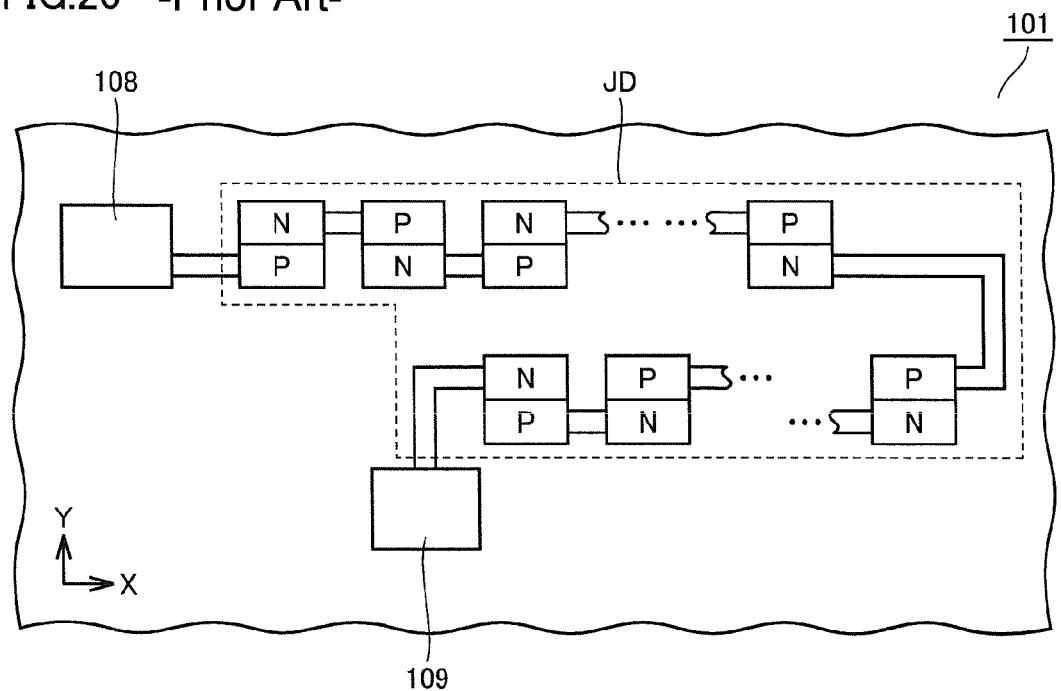

SEMICONDUCTOR DEVICE

CROSS REFERENCE TO RELATED APPLICATIONS

This application claims benefit of priority to Japanese Patent Application 2014-192664 filed Sep. 22, 2014, and to International Patent Application No. PCT/JP2015/066739 filed Jun. 10, 2015, the entire content of which is incorporated herein by reference.

TECHNICAL FIELD

The present disclosure relates to a semiconductor device, and more particularly, to a semiconductor device including diodes used as ESD protection elements.

BACKGROUND

As a transistor forming a power amplifier module such as that in a mobile terminal, a heterojunction bipolar transistor (HTB) is used. This type of bipolar transistor has a mesa structure.

In order to prevent the occurrence of failures in a semiconductor element such as a bipolar transistor, for example, since the semiconductor element is damaged or malfunctions by electrostatic discharge, ESD (Electro Static Discharge) protection elements are formed in a semiconductor device. An example of ESD protection elements is diodes.

Concerning diodes used as ESD protection elements for a bipolar transistor, because of their electrical characteristics such as the ability to withstand voltage and the resistance, plural diodes are connected in series with each other. One of the patterns (layouts) concerning the arrangement of the plural diodes is the one in which a predetermined number of diodes JD are linearly connected to each other in one direction, as shown in FIG. 19.

In a semiconductor device 101 having this pattern, among the linearly connected plural diodes JD, an input terminal 108 is connected to a P-type region of a diode positioned at one end, while an output terminal 109 is connected to an N-type region of a diode JD positioned at the other end.

Examples of patent documents which disclose didoes used as ESD protection elements are Japanese Unexamined Patent Application Publication No. 2002-217374 and WO2001-18865.

SUMMARY

Technical Problem

However, there is the following problem in the known semiconductor devices. In a pattern in which plural diodes are linearly connected to each other in one direction, these diodes may interfere with a region (pattern) in which another element such as a semiconductor element is formed because of the finer design rules of semiconductor devices. As a result, the diodes may not be able to be disposed linearly.

To address this problem, as shown in FIG. 20, a pattern (turnaround pattern) is used in which a series of diodes JD connected in series with each other is turned around in some midpoint of this series of diodes JD. In this turnaround pattern, however, the output terminal 109 may be located close to the input terminal 108. An ESD test has proved that, depending on the positional relationship between the diode JD positioned at the input terminal 108 and the diode JD positioned at the output terminal 109, a current leakage from the diode JD positioned at the input terminal occurs, which may damage the diodes JD.

The present disclosure has been made to solve the above-described problem. It is an object of the disclosure to provide a semiconductor device in which diodes used as ESD protection elements are less likely to be damaged by electrostatic discharge.

Solution to Problem

A semiconductor device according to the present disclosure includes a substrate having a main front surface, an input terminal and an output terminal, and a plurality of diodes. The input terminal and the output terminal are each formed on the substrate. The plurality of diodes are formed on the substrate and each include an N-type region and a P-type region. The plurality of diodes are sequentially connected in series with each other from the input terminal and are connected to the output terminal. In each of the plurality of diodes, the P-type region is formed so as to contact part of the N-type region in such a manner that the N-type region and the P-type region overlap in a plan view. The plurality of diodes are connected in series with each other and include first and second series-connecting portions. The first series-connecting portion extends from the input terminal in a first direction, and a current flows from the input terminal through the first series-connecting portion. The second series-connecting portion has a section through which the current flows from the input terminal. The first series-connecting portion includes a first diode, which is the first diode counted from the input terminal. The second series-connecting portion includes a last diode, which is the first diode counted from the output terminal. The last diode is disposed separately from the first diode with some distance therebetween in a second direction which intersects with the first direction. The first diode and the last diode are arranged in a manner other than an arrangement in which the P-type region of the first diode and the N-type region of the last diode directly oppose each other in the plan view.

According to this semiconductor device, the first diode and the last diode are arranged in a manner other than the arrangement in which the P-type region of the first diode and the N-type region of the last diode directly oppose each other as viewed in a planar direction. Thus, the possibility that the diodes will be damaged by electrostatic discharge can be reduced.

The first diode and the last diode may preferably be arranged in the reverse direction, which is opposite to the forward direction, in such a manner that the N-type region of the first diode and the P-type region of the last diode directly oppose each other as viewed in a planar direction. Alternatively, the first diode and the last diode may be arranged in such a manner that the P-type region of the first diode and the P-type region of the last diode directly oppose each other as viewed in a planar direction. Alternatively, the first diode and the last diode may be arranged in such a manner that the N-type region of the first diode and the N-type region of the last diode directly oppose each other as viewed in a planar direction.

The last diode may be disposed separately from the first diode with some distance therebetween in the second direction, the second direction being a direction perpendicular to the first direction. "Perpendicular" does not mean geometrically strict perpendicularity and allows some manufacturing variations.

The last diode may be disposed separately from the first diode with some distance therebetween in the second direction, the second direction being a direction obliquely tilting with respect to a direction perpendicular to the first direction. In this case, the last diode may preferably be disposed separately from a second diode, which is the second diode counted from the input terminal, with some distance therebetween in a direction perpendicular to the first direction. The last diode may preferably be disposed in such a manner that a diode, which is the second diode counted from the output terminal, is disposed separately from the first diode in a direction perpendicular to the first direction.

Another semiconductor device according to the present disclosure includes a substrate having a main front surface, an input terminal and an output terminal, and a plurality of diodes. The input terminal and the output terminal are each formed on the substrate. The plurality of diodes are formed on the substrate and each include an N-type region and a P-type region. The plurality of diodes are sequentially connected in series with each other from the input terminal and are connected to the output terminal. In each of the plurality of diodes, the P-type region is formed so as to contact part of the N-type region in such a manner that the N-type region and the P-type region are located as viewed in a planar direction. The plurality of diodes connected in series with each other includes first and second series-connecting portions. The first series-connecting portion extends from the input terminal in a first direction, and a current flows to separate from the input terminal through the first series-connecting portion. The second series-connecting portion has a section through which a current flows to approach the input terminal. The first series-connecting portion includes a first diode, which is the first diode counted from the input terminal. The second series-connecting portion includes an intermediate diode which is positioned closest to the first diode and which is other than the first diode counted from the output terminal. The intermediate diode is disposed separately from the first diode with some distance therebetween in a second direction which intersects with the first direction. The first diode and the intermediate diode are arranged in a manner other than an arrangement in which the P-type region of the first diode and the N-type region of the intermediate diode directly oppose each other as viewed in a planar direction.

According to this semiconductor device, the first diode and the intermediate diode positioned closest to the first diode are arranged in a manner other than the arrangement in which the P-type region of the first diode and the N-type region of the intermediate diode directly oppose each other as viewed in a planar direction. Thus, the possibility that the diodes will be damaged by electrostatic discharge can be reduced.

The first diode and the intermediate diode may preferably be arranged in the reverse direction, which is opposite to the forward direction, in such a manner that the N-type region of the first diode and the P-type region of the intermediate diode directly oppose each other as viewed in a planar direction. Alternatively, the first diode and the intermediate diode may be arranged in such a manner that the P-type region of the first diode and the P-type region of the intermediate diode directly oppose each other as viewed in a planar direction. Alternatively, the first diode and the intermediate diode may be arranged in such a manner that the N-type region of the first diode and the N-type region of the intermediate diode directly oppose each other as viewed in a planar direction.

The intermediate diode may be disposed separately from the first diode with some distance therebetween in the second direction, the second direction being a direction perpendicular to the first direction. "Perpendicular" does not mean geometrically strict perpendicularity and allows some manufacturing variations.

The intermediate diode may be disposed separately from the first diode with some distance therebetween in the second direction, the second direction being a direction obliquely tilting with respect to a direction perpendicular to the first direction. In this case, the intermediate diode may preferably be disposed separately from a second diode, which is the second diode counted from the input terminal, with some distance therebetween in a direction perpendicular to the first direction. The intermediate diode may preferably be disposed in such a manner that a diode positioned one before the intermediate diode counted from the input terminal is disposed separately from the first diode in the second direction perpendicular to the first direction.

BRIEF DESCRIPTION OF THE DRAWINGS

FIG. 19 is a partial plan view illustrating an arrangement of series-connected diodes in a known semiconductor device.

FIG. 20 is a partial plan view illustrating another arrangement of series-connected diodes in a known semiconductor device.

DETAILED DESCRIPTION

As described above, regarding diodes used as ESD protection elements for a bipolar transistor, because of the finer design rules of semiconductor devices, a pattern (turnaround pattern) is used in which a series of diodes connected in series with each other is turned around in some midpoint of this series of diodes.

It is known that, in a pattern in which plural diodes are linearly disposed, input of an excessive electrostatic discharge into an input terminal causes damage to the diodes starting from the first diode counted from the input terminal. In a turnaround pattern, an input terminal and an output terminal may be located closely. Because of this positional arrangement, a current leakage may occur, for example, in a portion where wiring lines are located most closely, which may cause damage in the turnaround pattern. However, hardly any specific analysis has been made for the reason for causing damage in the turnaround pattern. Thus, the basic design rules are that the input terminal and the output terminal are separated from each other as far as possible.

The present inventors have conducted an ESD test for various turnaround patterns and then obtained the knowledge about damage to diodes caused by electrostatic discharge. As the ESD test, a HBM (Human Body Model) test is conducted. The HBM test is a test for simulating a phenomenon of discharge of electric charges accumulated in a human body to an electronic component, and is known as the most common ESD test. In this HBM test, semiconductor devices in which diodes are less likely to be damaged have been obtained. In the following embodiments, such semiconductor devices will be specifically discussed.

First Embodiment

A first mode of the arrangement in which the first diode counted from an input terminal and the first diode counted from an output terminal (the last diode counted from the input terminal) oppose each other will be described below.

Figure 1:
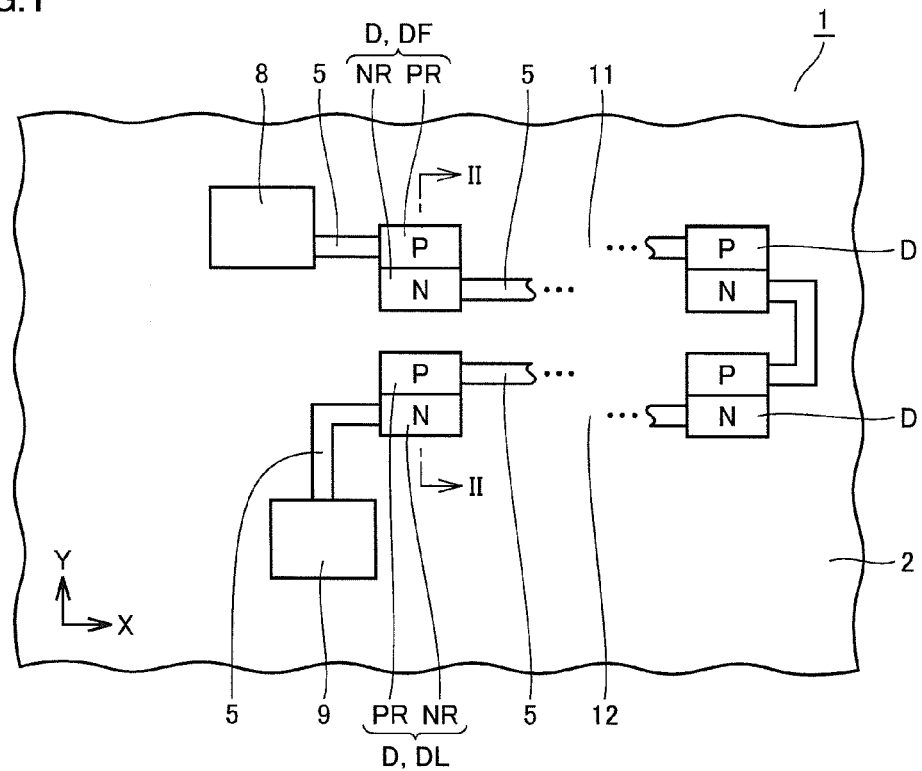
FIG. 1 is a partial plan view illustrating an arrangement of series-connected diodes in a semiconductor device according to a first embodiment of the present disclosure.
Figure 2:
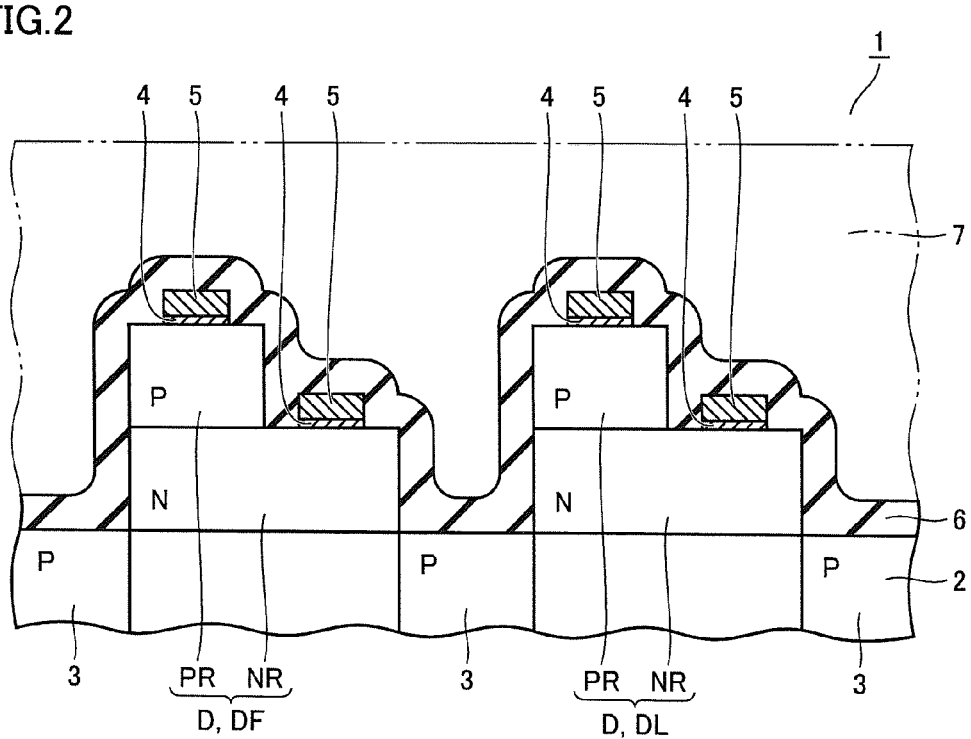
FIG. 2 is a partial sectional view taken along line II-II in FIG. 1 in the first embodiment.

As shown in FIGS. 1 and 2, on an N-type GaAs substrate 2 of a semiconductor device 1, plural diodes D each including an N-type region NR and a P-type region PR are formed as ESD protection elements. The plural diodes D are electrically connected in series with each other. Among the plural diodes D connected in series with each other, an input terminal 8 is electrically connected to the P-type region PR of the diode D positioned at one end, and an output terminal 9 is electrically connected to the N-type region NR of the diode D positioned at the other end.

Each of the plural diodes D is electrically isolated from the other diodes D by a P-type isolation region 3 shown in FIG. 2, for example. In each of the plural diodes D, the N-type region NR is divided into two areas as viewed in a planar direction as shown in FIG. 1, and the P-type region PR is formed so as to contact the surface of one area of the N-type region NR in such a manner that the N-type region NR and the P-type region PR are located as viewed in a planar direction. In this specification, "as viewed in a planar direction" means being in a two-dimensional pattern, and more specifically, in a pattern as viewed from a direction substantially perpendicular to the main front surface of the substrate.

The plural diodes D are connected in series with each other in a forward direction between the input terminal 8 and the output terminal 9 in such a manner that the top surface of the N-type region NR of one diode D is electrically connected to the top surface of the P-type region PR of an adjacent diode D by wiring 5, as shown in FIG. 2. The wiring 5 is made of gold (Au), for example. A barrier metal 4 (see FIG. 2) which prevents the diffusion of gold is formed between the wiring 5 and the top surface of a P-type region PR (the top surface of an N-type region NR). In FIG. 1, for example, the wiring positioned on the top surfaces of the P-type regions PR, for example, are not shown because the conductivity types of the diodes are indicated thereon.

As shown in FIG. 1, the connection patterns of the plural diodes D include one turnaround pattern. By the provision of the turnaround pattern, the connection patterns of the plural diodes D include a series connection pattern 11 (first series-connecting portion) and a series connection pattern 12 (second series-connecting portion). The series connection pattern 11 extends from the input terminal 8 in the X direction through which a current flows to separate from the input terminal 8. The series connection pattern 12 has a portion through which a current flows to approach the input terminal 8. The series connection patterns 11 and 12 include portions substantially parallel with each other.

The series connection pattern 11 includes a diode DF, which is the first diode counted from the input terminal 8. If static electricity is input into the input terminal, the highest voltage is applied to the first diode DF. The series connection pattern 12 includes a diode DL, which is the first diode counted from the output terminal 9, that is, the last diode counted from the input terminal 8. The diode DL is disposed separately from the diode DF with some distance therebetween in the Y direction substantially perpendicular to the X direction.

Concerning the diodes DF and DL, the N-type region NR of the diode DF and the P-type region PR of the diode DL directly oppose each other as viewed in a planar direction. "Directly oppose each other" means that the N-type region NR of the diode DF and the P-type region PR of the diode DL oppose each other without another diode interposed therebetween as viewed in a planar direction.

A silicon nitride film 6 (see FIG. 2) is formed on the GaAs substrate 2 so as to cover the plural diodes D and the wiring 5. To further cover the silicon nitride film 6, an insulating film 7 (see FIG. 2) made of polyimide, for example, is formed. In a predetermined region of the GaAs substrate 2 of the semiconductor device 1, a heterojunction bipolar transistor having a mesa structure (not shown), for example, is formed as a semiconductor element to be protected by the diodes D (ESD protection elements).

In a semiconductor device including a bipolar transistor having a mesa structure, diodes D are formed at the same time as forming a collector (N type) and a base (P type) of the bipolar transistor. More specifically, when the collector is formed, the N-type regions NR of the diodes D are formed, and when the base is formed, the P-type regions PR of the diodes D are formed. Then, the diodes D are also formed in a mesa structure.

In the diodes D used as ESD protection elements in the above-described semiconductor device 1, the N-type region NR of the diode DF and the P-type region PR of the diode DL directly oppose each other as viewed in a planar direction. As viewed from the input terminal 8, the direction from the N-type region NR of the diode DF to the P-type region PR of the diode DL is the reverse direction, and thus, the withstand voltage is increased. As a result, the possibility that the diodes D will be damaged by electrostatic discharge can be reduced. This will be explained below by comparison with a semiconductor device of a comparative example.

Figure 3:
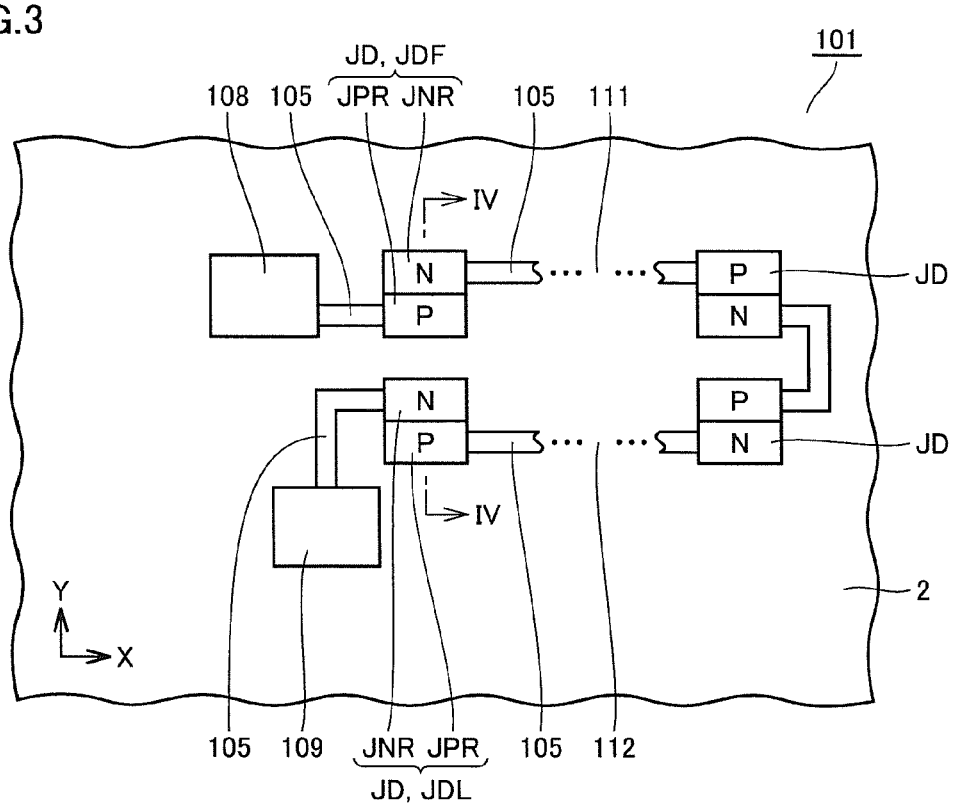
FIG. 3 is a partial plan view illustrating an arrangement of series-connected diodes in a semiconductor device according to a comparative example.
Figure 4:
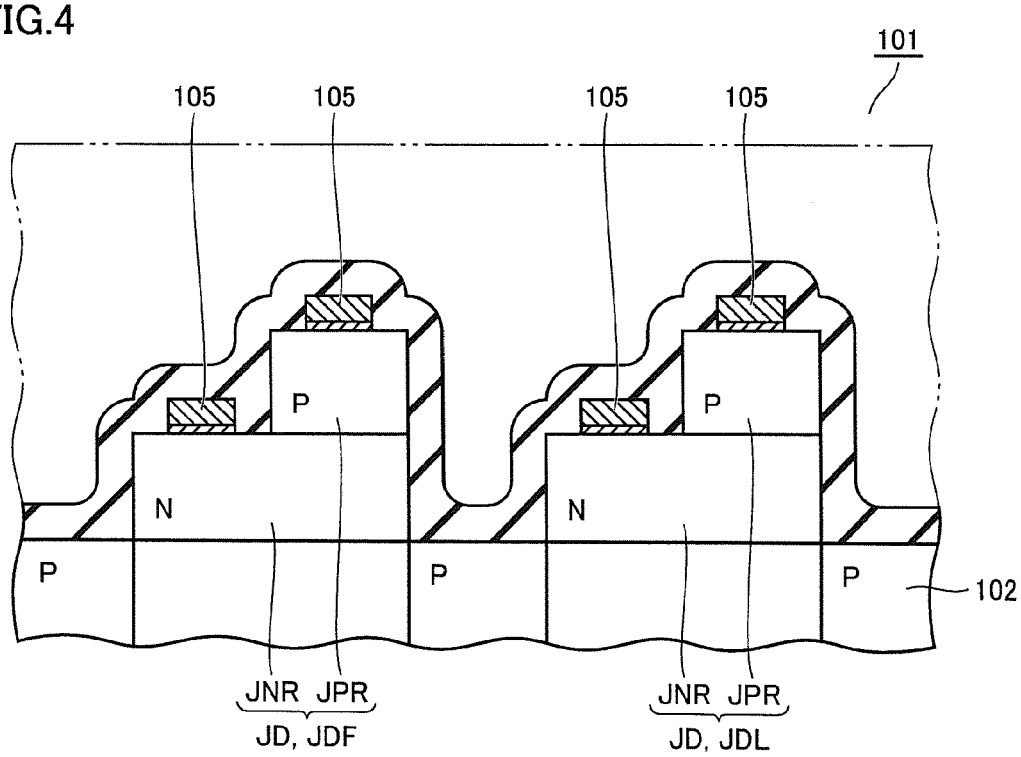
FIG. 4 is a partial sectional view taken along line IV-IV in FIG. 3.

As shown in FIGS. 3 and 4, on an N-type GaAs substrate 102 of a semiconductor device 101 according to the comparative example, plural diodes JD are electrically connected in series with each other by wiring 105 between an input terminal 108 and an output terminal 109. In each of the plural diodes JD, the top surface of the N-type region JNR is divided into two areas, and the P-type region JPR is formed so as to contact the top surface of the N-type region JNR in such a manner that the N-type region JNR and the P-type region JPR are located as viewed in a planar direction.

The connection patterns of the plural diodes JD include one turnaround pattern and series connection patterns 111 and 112. In the series connection pattern 111, a current flows to separate from the input terminal 108 in the X direction. In the series connection pattern 112, a current flows to approach the input terminal 108. The series connection pattern 111 includes a diode JDF, which is the first diode counted from the input terminal 108. The series connection pattern 112 includes a diode JDL, which is the last diode counted from the input terminal 108.

The diode JDL is disposed separately from the diode JDF with some distance therebetween in the Y direction substantially perpendicular to the X direction. The diodes JDF and JDL are disposed such that the P-type region JPR of the diode JDF and the N-type region JNR of the diode JDL directly oppose each other as viewed in a planar direction. The semiconductor device 101 of the comparative example is configured as described above.

In the semiconductor device 101 of the comparative example, the diode JDF, which is the first diode counted from the input terminal 108, and the diode JDL, which is the first diode counted from the output terminal 109, that is, the last diode counted from the input terminal 108, oppose each other as viewed in a planar direction. Moreover, the P-type region JPR of the diode JDF and the N-type region JNR of the diode JDL directly oppose each other as viewed in a planar direction.

With this arrangement, with the application of a voltage of about several hundreds of volts to the input terminal 108 by a pulse stress in an ESD test, the voltage is applied between the diodes JDF and JDL in the forward direction. Thus, a current leakage is likely to occur, and the instant that a current leakage occurs, thermal runaway is caused, which leads to a breakdown.

In contrast to the semiconductor device 101 of the comparative example, in the above-described semiconductor device 1, although the diode DF, which is the first diode counted from the input terminal 8, and the diode DL, which is the last diode counted from the input terminal 8, oppose each other as viewed in a planar direction, the N-type region NR of the diode DF and the P-type region PR of the diode DL directly oppose each other as viewed in a planar direction.

With the application of a voltage of about several hundreds of volts to the input terminal 8, the voltage is applied between the diodes DF and DL in the reverse direction. Thus, a current leakage from the diode DF to the diode DL is less likely to occur than when the voltage is applied between the diodes JDF and JDL in the forward direction. As a result, the possibility that the diodes D will be damaged or malfunction by electrostatic discharge can be reduced.

In the above-described semiconductor device 1, as the turnaround pattern, the series of diodes D is turned around only at one portion. However, the number of turnaround patterns is not restricted to one. Depending on the relationship with the pattern of another semiconductor element (not shown), for example, plural turnaround patterns may be provided. This enhances the flexibility regarding the region (pattern) in which the diodes D used as ESD protection elements are disposed in the above-described semiconductor device 1, thereby contributing to finer design rules of the semiconductor device 1.

First Modified Example of First Embodiment

Concerning the arrangement of the N-type region NR and P-type region PR of the diodes DF and DL, a first modified example will be described below.

Figure 5:
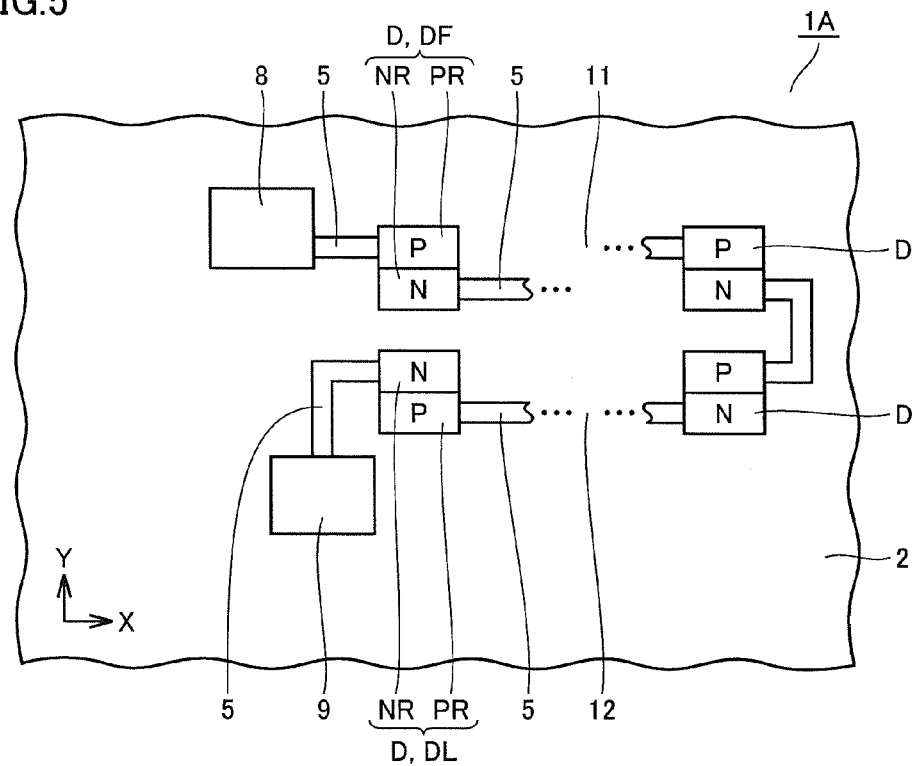
FIG. 5 is a partial plan view illustrating an arrangement of series-connected diodes in a semiconductor device according to a first modified example of the first embodiment.

As shown in FIG. 5, in a semiconductor device 1A of the first modified example, the diode DL is disposed separately from the diode DF with some distance therebetween in the Y direction substantially perpendicular to the X direction. Concerning the diodes DF and DL, the N-type region NR of the diode DF and the N-type region NR of the diode DL directly oppose each other as viewed in a planar direction.

The configuration of the portions other than this portion is similar to that of the semiconductor device 1 shown in FIG. 1. Thus, the same elements as those shown in FIG. 1 are designated by like reference numerals, and an explanation thereof will not be repeated unless it is necessary.

In the semiconductor device 1A according to the first modified example of the first embodiment, the N-type region NR of the diode DF and the N-type region NR of the diode DL directly oppose each other as viewed in a planar direction. With this configuration, when a voltage of about several hundreds of volts is applied to the input terminal 8, a current leakage from the diode DF to the diode DL is less likely to occur than in the semiconductor device 101 (see FIGS. 3 and 4) of the comparative example in which the voltage is applied between the diodes JDF and JDL in the forward direction. As a result, the possibility that the diodes D will be damaged or malfunction by electrostatic discharge can be reduced.

Second Modified Example of First Embodiment

Concerning the arrangement of the N-type region NR and P-type region PR of the diodes DF and DL, a second modified example will be described below.

Figure 6:
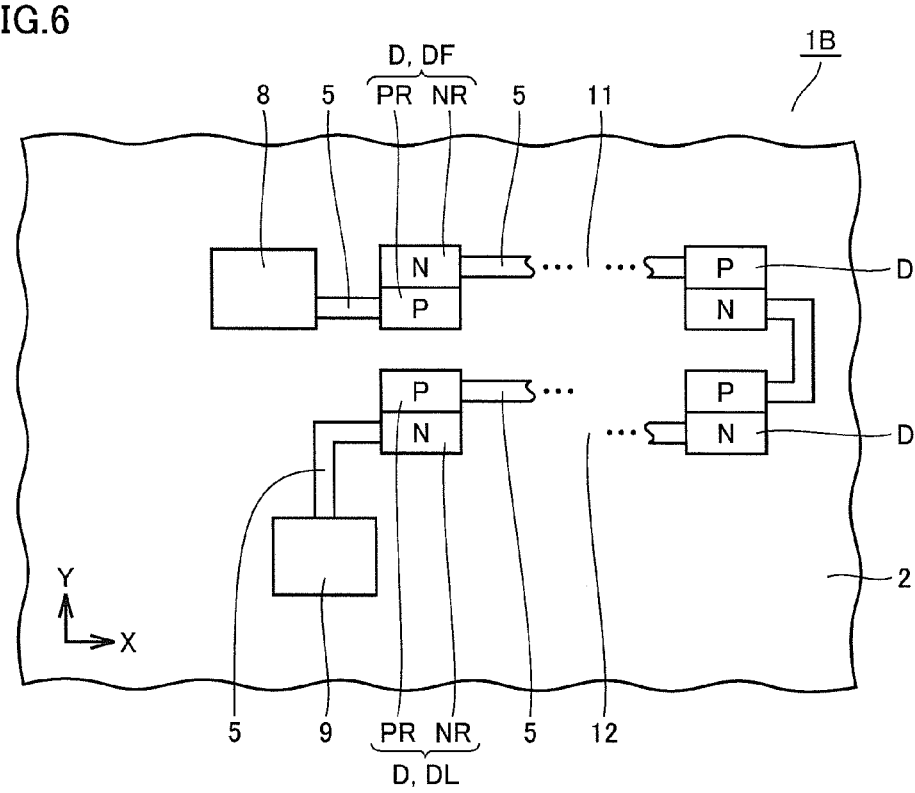
FIG. 6 is a partial plan view illustrating an arrangement of series-connected diodes in a semiconductor device according to a second modified example of the first embodiment.

As shown in FIG. 6, in a semiconductor device 1B of the second modified example, the diode DL is disposed separately from the diode DF with some distance therebetween in the Y direction substantially perpendicular to the X direction. Concerning the diodes DF and DL, the P-type region PR of the diode DF and the P-type region PR of the diode DL directly oppose each other as viewed in a planar direction.

The configuration of the portions other than this portion is similar to that of the semiconductor device 1 shown in FIG. 1. Thus, the same elements as those shown in FIG. 1 are designated by like reference numerals, and an explanation thereof will not be repeated unless it is necessary.

In the semiconductor device 1B according to the second modified example of the first embodiment, the P-type region PR of the diode DF and the P-type region PR of the diode DL directly oppose each other as viewed in a planar direction. With this configuration, when a voltage of about several hundreds of volts is applied to the input terminal 8, a current leakage from the diode DF to the diode DL is less likely to occur than in the semiconductor device 101 (see FIGS. 3 and 4) of the comparative example in which the voltage is applied between the diodes JDF and JDL in the forward direction. As a result, the possibility that the diodes D will be damaged or malfunction by electrostatic discharge can be reduced.

In the semiconductor devices 1A and 1B according to the first and second modified examples of the first embodiment, too, the number of turnaround patterns is not restricted to one. Depending on the relationship with the pattern of another semiconductor element (not shown), for example, plural turnaround patterns may be provided. This enhances the flexibility regarding the region (pattern) in which the diodes D used as ESD protection elements are disposed, thereby contributing to finer design rules of the semiconductor devices 1A and 1B.

Second Embodiment

A second mode of the arrangement in which the first diode counted from the input terminal and the last diode counted from the input terminal oppose each other will be described below.

Figure 7:
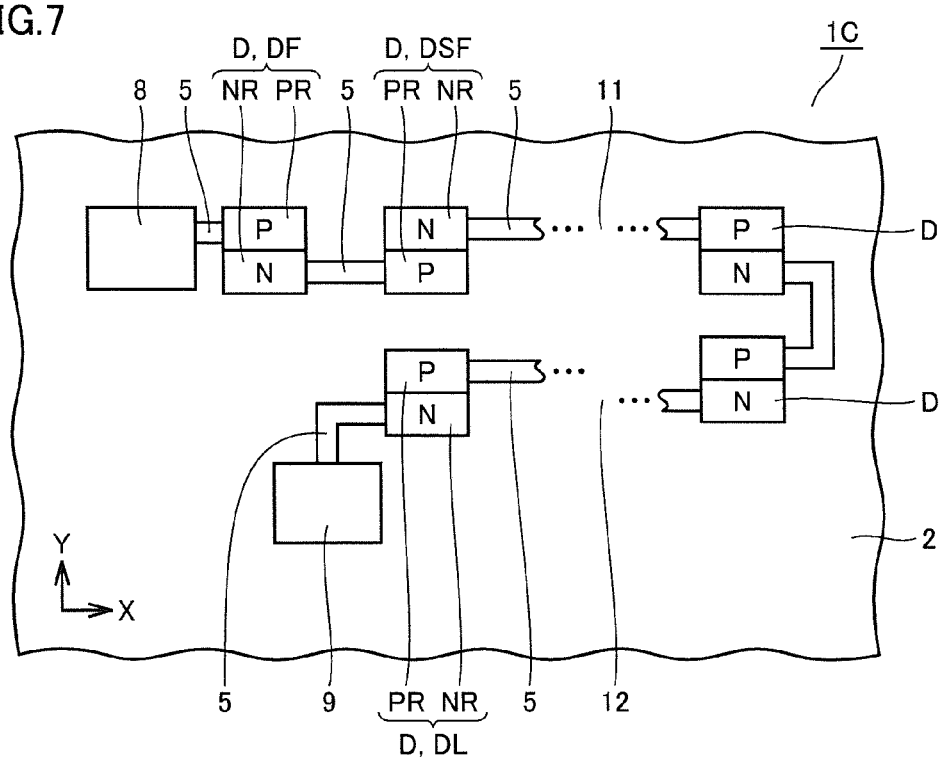
FIG. 7 is a partial plan view illustrating an arrangement of series-connected diodes in a semiconductor device according to a second embodiment of the present disclosure.

As shown in FIG. 7, in a semiconductor device 1C, a diode DL, which is the last diode counted from the input terminal 8, is disposed separately from a diode DSF, which is the second diode counted from the input terminal 8, with some distance therebetween in the Y direction substantially perpendicular to the X direction. That is, concerning the positional relationship between the diode DL and the first diode DF counted from the input terminal 8 to which the highest voltage is applied, the diodes DF and DL are disposed obliquely in the X direction (or in the Y direction) with some distance therebetween (oblique opposing arrangement).

Concerning the diodes DF and DL, the N-type region NR of the diode DF and the P-type region PR of the diode DL directly oppose each other obliquely as viewed in a planar direction. The configuration of the portions other than this portion is similar to that of the semiconductor device 1 shown in FIG. 1. Thus, the same elements as those shown in FIG. 1 are designated by like reference numerals, and an explanation thereof will not be repeated unless it is necessary.

In the above-described semiconductor device 1C, the N-type region NR of the diode DF and the P-type region PR of the diode DL directly oppose each other obliquely as viewed in a planar direction. With this configuration, when a voltage of about several hundreds of volts is applied to the input terminal 8, a current leakage from the diode DF to the diode DL is less likely to occur than in the arrangement in which the voltage is applied between the diodes DF and DL in the forward direction, such as in the above-described semiconductor device (see FIGS. 3 and 4) of the comparative example. As a result, the possibility that the diodes D will be damaged or malfunction by electrostatic discharge can be reduced.

In the above-described semiconductor device 1C, too, the number of turnaround patterns is not restricted to one. Depending on the relationship with the pattern of another semiconductor element (not shown), for example, plural turnaround patterns may be provided. This enhances the flexibility regarding the region (pattern) in which the diodes D used as ESD protection elements are disposed, thereby contributing to finer design rules of the semiconductor device 1C.

First Modified Example of Second Embodiment

Concerning the arrangement of the N-type region NR and P-type region PR of the diodes DF and DL, a first modified example will be described below.

Figure 8:
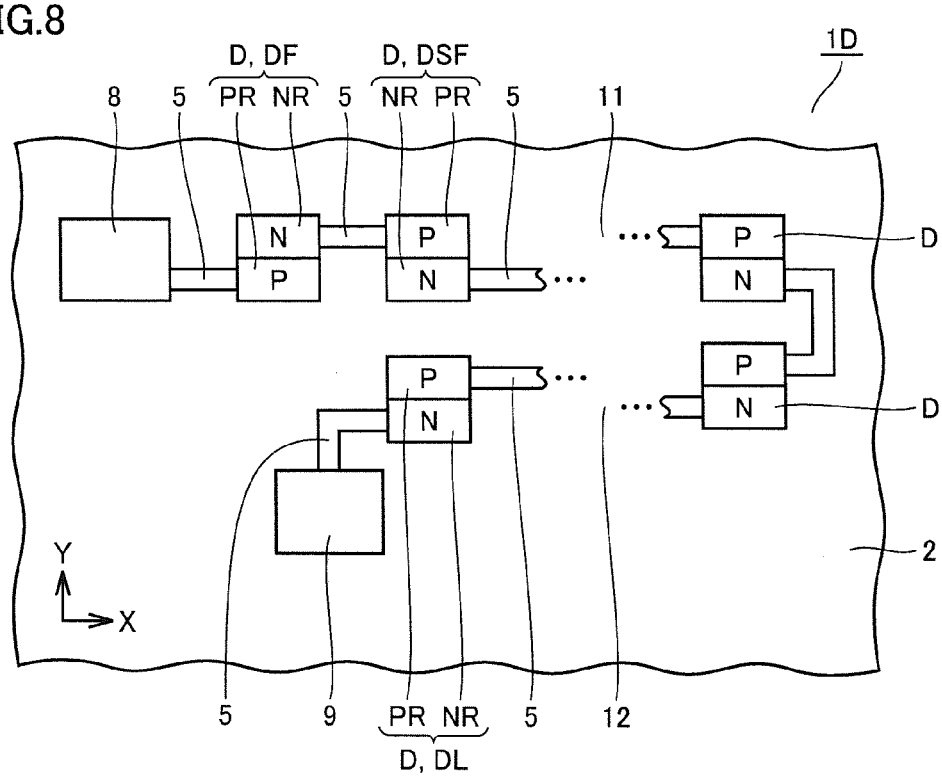
FIG. 8 is a partial plan view illustrating an arrangement of series-connected diodes in a semiconductor device according to a first modified example of the second embodiment.

As shown in FIG. 8, in a semiconductor device 1D of the first modified example, the diodes DF and DL are disposed obliquely in the X direction (or in the Y direction) with some distance therebetween (oblique opposing). Moreover, the P-type region PR of the diode DF and the P-type region PR of the diode DL directly oppose each other obliquely as viewed in a planar direction. The configuration of the portions other than this portion is similar to that of the semiconductor devices 1 and 1D shown in FIGS. 1 and 7. Thus, the same elements as those shown in FIGS. 1 and 7 are designated by like reference numerals, and an explanation thereof will not be repeated unless it is necessary.

In the semiconductor device 1D according to the first modified example of the second embodiment, the P-type region PR of the diode DF and the P-type region PR of the diode DL directly oppose each other obliquely as viewed in a planar direction. With this configuration, when a voltage of about several hundreds of volts is applied to the input terminal 8, a current leakage from the diode DF to the diode DL is less likely to occur than in the arrangement in which the voltage is applied between the diodes DF and DL in the forward direction, such as in the above-described semiconductor device (see FIGS. 3 and 4) of the comparative example. As a result, the possibility that the diodes D will be damaged or malfunction by electrostatic discharge can be reduced.

Second Modified Example of Second Embodiment

Concerning the arrangement of the N-type region NR and P-type region PR of the diodes DF and DL, a second modified example will be described below.

Figure 9:
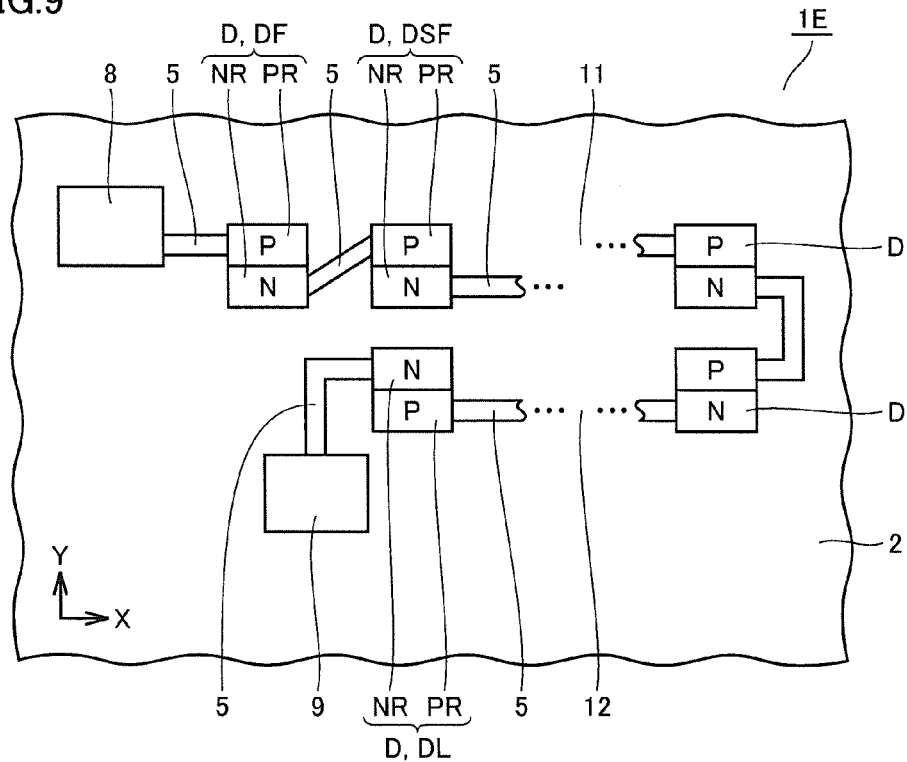
FIG. 9 is a partial plan view illustrating an arrangement of series-connected diodes in a semiconductor device according to a second modified example of the second embodiment.

As shown in FIG. 9, in a semiconductor device 1E of the second modified example, the diodes DF and DL are disposed obliquely in the X direction (or in the Y direction) with some distance therebetween (oblique opposing). Moreover, the N-type region NR of the diode DF and the N-type region NR of the diode DL directly oppose each other obliquely as viewed in a planar direction. The configuration of the portions other than this portion is similar to that of the semiconductor devices 1 and 1D shown in FIGS. 1 and 7. Thus, the same elements as those shown in FIGS. 1 and 7 are designated by like reference numerals, and an explanation thereof will not be repeated unless it is necessary.

In the semiconductor device 1E according to the second modified example of the second embodiment, the N-type region NR of the diode DF and the N-type region NR of the diode DL directly oppose each other obliquely as viewed in a planar direction. With this configuration, when a voltage of about several hundreds of volts is applied to the input terminal 8, a current leakage from the diode DF to the diode DL is less likely to occur than in the arrangement in which the voltage is applied between the diodes DF and DL in the forward direction, such as in the above-described semiconductor device (see FIGS. 3 and 4) of the comparative example. As a result, the possibility that the diodes D will be damaged or malfunction by electrostatic discharge can be reduced.

In the semiconductor devices 1D and 1E according to the first and second modified examples of the second embodiment, too, the number of turnaround patterns is not restricted to one. Depending on the relationship with the pattern of another semiconductor element (not shown), for example, plural turnaround patterns may be provided. This enhances the flexibility regarding the region (pattern) in which the diodes D used as ESD protection elements are disposed, thereby contributing to finer design rules of the semiconductor devices 1D and 1E.

In the semiconductor devices 1C, 1D, and 1E, the diodes DL and DSF are disposed with some distance therebetween in the Y direction substantially perpendicular to the X direction. It is thus preferable that the diodes DL and DSF be arranged in a manner other than the arrangement (forward direction) in which the P-type region PR of the diode DSF and the N-type region NR of the diode DL directly oppose each other as viewed in a planar direction.

In the semiconductor devices 1D and 1E including the first and second modified examples of the second embodiment, as the oblique opposing arrangement of the diodes DF and DL, the diodes DF and DL are disposed obliquely in the X direction (or in the Y direction) with some distance therebetween in such a manner that the diode DL is disposed separately from the diode DSF with some distance therebetween in the Y direction.

Figure 10:
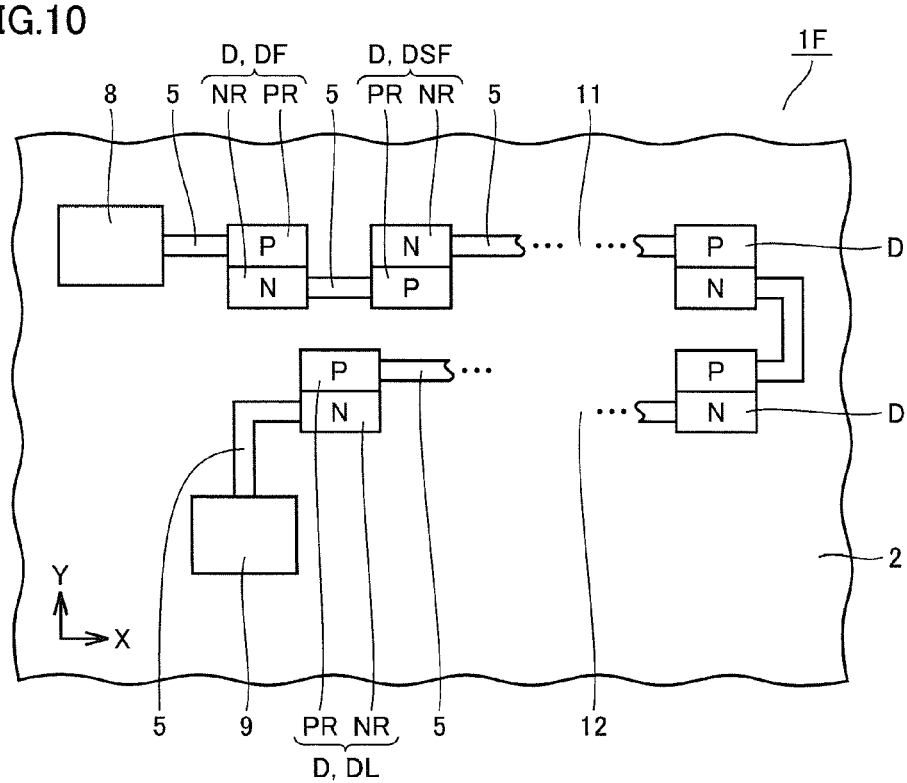
FIG. 10 is a partial plan view illustrating an arrangement of series-connected diodes in a semiconductor device according to a third modified example of the second embodiment.

The oblique opposing arrangement is not restricted to this arrangement. In a semiconductor device 1F shown in FIG. 10, for example, the diode DL is disposed separately from the diode DF in the Y direction with some distance therebetween and is then somewhat displaced from the diode DF in the X direction (a third modified example of the second embodiment).

In the semiconductor device 1F with this oblique opposing arrangement, the N-type region NR of the diode DF and the P-type region PR of the diode DL oppose each other obliquely as viewed in a planar direction so that the diodes DF and DL are not positioned in the forward direction. As a result, the possibility that the diodes D will be damaged or malfunction by electrostatic discharge can be reduced.

In the above-described semiconductor devices 1C, 1D, and 1E, as the oblique opposing arrangement of the diodes DF and DL, the last diode DL is disposed separately from the second diode DSF with some distance therebetween in the Y direction (the diode DL is displaced from the diode DF by one diode).

As the oblique opposing arrangement of the diodes DF and DL, the last diode DL may be disposed separately from the third diode (not shown) counted from the input terminal with some distance therebetween in the Y direction (the diode DL is displaced from the diode DF by two diodes).

Third Embodiment

A third mode of the arrangement in which the first diode counted from the input terminal and the last diode counted from the input terminal oppose each other will be described below.

Figure 11:
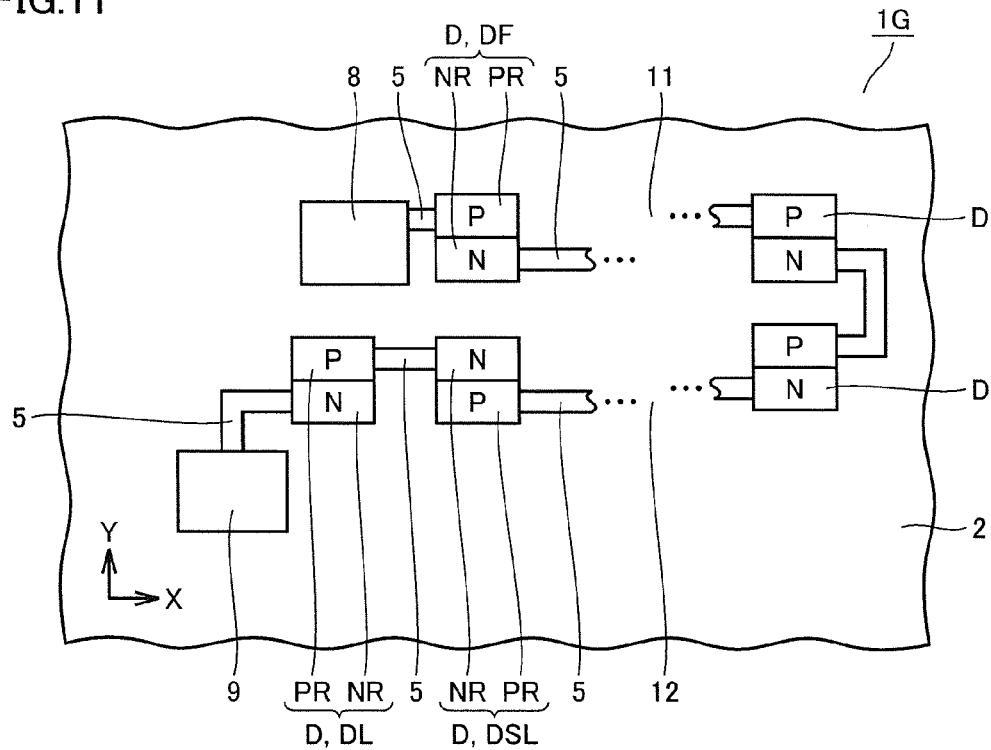
FIG. 11 is a partial plan view illustrating an arrangement of series-connected diodes in a semiconductor device according to a third embodiment of the present disclosure.

As shown in FIG. 11, in a semiconductor device 1G, a diode DSL, which is the second last diode counted from the input terminal, is disposed separately from the first diode DF with some distance therebetween in the Y direction substantially perpendicular to the X direction. The diodes DF and DL are disposed obliquely in the X direction (or in the Y direction) with some distance therebetween (oblique opposing arrangement). Concerning the diodes DF and DL, the N-type region NR of the diode DF and the P-type region PR of the diode DL directly oppose each other obliquely as viewed in a planar direction.

Concerning the diode DF and the diode DSL positioned closest to the diode DF, the N-type region NR of the diode DF and the N-type region NR of the diode DSL directly oppose each other as viewed in a planar direction. The configuration of the portions other than this portion is similar to that of the semiconductor device 1 shown in FIG. 1. Thus, the same elements as those shown in FIG. 1 are designated by like reference numerals, and an explanation thereof will not be repeated unless it is necessary.

In the above-described semiconductor device 1G, the N-type region NR of the diode DF and the P-type region PR of the diode DL directly oppose each other obliquely as viewed in a planar direction. The N-type region NR of the diode DF and the N-type region NR of the diode DSL directly oppose each other as viewed in a planar direction.

With this configuration, when a voltage of about several hundreds of volts is applied to the input terminal 8, a current leakage from the diode DF to the diode DL is less likely to occur and a current leakage from the diode DF to the diode DSL is also less likely to occur than in the arrangement in which the voltage is applied between the diodes DF and DL in the forward direction, such as in the above-described semiconductor device (see FIGS. 3 and 4) of the comparative example. As a result, the possibility that the diodes D will be damaged or malfunction by electrostatic discharge can be reduced.

In the above-described semiconductor device 1G, too, the number of turnaround patterns is not restricted to one. Depending on the relationship with the pattern of another semiconductor element (not shown), for example, plural turnaround patterns may be provided. This enhances the flexibility regarding the region (pattern) in which the diodes D used as ESD protection elements are disposed, thereby contributing to finer design rules of the semiconductor device 1G.

First Modified Example of Third Embodiment

Concerning the arrangement of the N-type region NR and P-type region PR of the diodes DF and DL, a first modified example will be described below.

Figure 12:
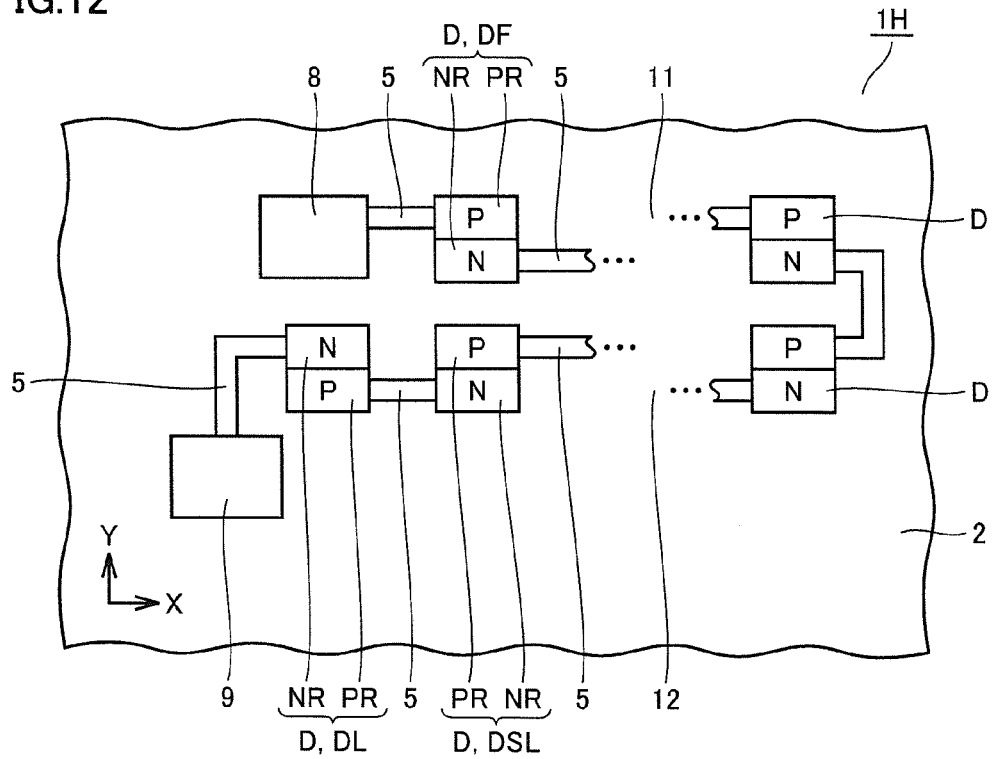
FIG. 12 is a partial plan view illustrating an arrangement of series-connected diodes in a semiconductor device according to a first modified example of the third embodiment.

As shown in FIG. 12, in a semiconductor device 1H according to the first modified example, the diodes DF and DL are disposed obliquely in the X direction (or in the Y direction) with some distance therebetween (oblique opposing arrangement). Concerning the diodes DF and DL, the N-type region NR of the diode DF and the N-type region NR of the diode DL directly oppose each other obliquely as viewed in a planar direction.

Concerning the diode DF and the diode DSL positioned closest to the diode DF, the N-type region NR of the diode DF and the P-type region PR of the diode DSL directly oppose each other as viewed in a planar direction. The configuration of the portions other than this portion is similar to that of the semiconductor devices 1 and 1G shown in FIGS. 1 and 11. Thus, the same elements as those shown in FIGS. 1 and 11 are designated by like reference numerals, and an explanation thereof will not be repeated unless it is necessary.

In the above-described semiconductor device 1H, the N-type region NR of the diode DF and the N-type region NR of the diode DL directly oppose each other obliquely as viewed in a planar direction. The N-type region NR of the diode DF and the P-type region PR of the diode DSL directly oppose each other as viewed in a planar direction.

With this configuration, when a voltage of about several hundreds of volts is applied to the input terminal 8, a current leakage from the diode DF to the diode DL is less likely to occur and a current leakage from the diode DF to the diode DSL is also less likely to occur than in the arrangement in which the voltage is applied between the diodes DF and DL in the forward direction, such as in the above-described semiconductor device (see FIGS. 3 and 4) of the comparative example. As a result, the possibility that the diodes D will be damaged or malfunction by electrostatic discharge can be reduced.

Second Modified Example of Third Embodiment

Concerning the arrangement of the N-type region NR and P-type region PR of the diodes DF and DL, a second modified example will be described below.

Figure 13:
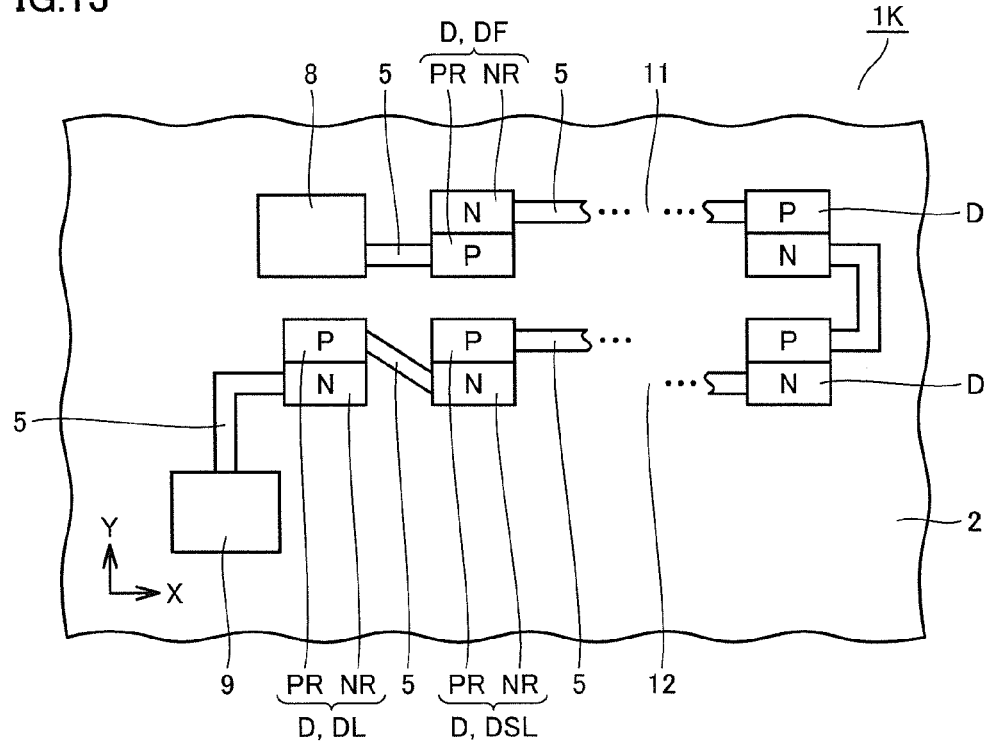
FIG. 13 is a partial plan view illustrating an arrangement of series-connected diodes in a semiconductor device according to a second modified example of the third embodiment.

As shown in FIG. 13, in a semiconductor device 1K according to the second modified example, the diodes DF and DL are disposed obliquely in the X direction (or in the Y direction) with some distance therebetween (oblique opposing arrangement). Concerning the diodes DF and DL, the P-type region PR of the diode DF and the P-type region PR of the diode DL directly oppose each other obliquely as viewed in a planar direction.

Concerning the diode DF and the diode DSL positioned closest to the diode DF, the P-type region PR of the diode DF and the P-type region PR of the diode DSL directly oppose each other as viewed in a planar direction. The configuration of the portions other than this portion is similar to that of the semiconductor devices 1 and 1G shown in FIGS. 1 and 11. Thus, the same elements as those shown in FIGS. 1 and 11 are designated by like reference numerals, and an explanation thereof will not be repeated unless it is necessary.

In the above-described semiconductor device 1K, the P-type region PR of the diode DF and the P-type region PR of the diode DL directly oppose each other obliquely as viewed in a planar direction. The P-type region PR of the diode DF and the P-type region PR of the diode DSL directly oppose each other as viewed in a planar direction.

With this configuration, when a voltage of about several hundreds of volts is applied to the input terminal 8, a current leakage from the diode DF to the diode DL is less likely to occur and a current leakage from the diode DF to the diode DSL is also less likely to occur than in the arrangement in which the voltage is applied between the diodes DF and DL in the forward direction, such as in the above-described semiconductor device (see FIGS. 3 and 4) of the comparative example. As a result, the possibility that the diodes D will be damaged or malfunction by electrostatic discharge can be reduced.

In the semiconductor devices 1H and 1K of the first and second modified examples of the third embodiment, too, the number of turnaround patterns is not restricted to one. Depending on the relationship with the pattern of another semiconductor element (not shown), for example, plural turnaround patterns may be provided. This enhances the flexibility regarding the region (pattern) in which the diodes D used as ESD protection elements are disposed, thereby contributing to finer design rules of the semiconductor devices 1H and 1K.

In the semiconductor devices 1G, 1H, and 1K including the first and second modified examples of the third embodiment, as the oblique opposing arrangement of the diodes DF and DL, the diodes DF and DL are disposed obliquely in the X direction (or in the Y direction) with some distance therebetween in such a manner that the diode DSL is disposed separately from the diode DF with some distance therebetween in the Y direction.

Figure 14:
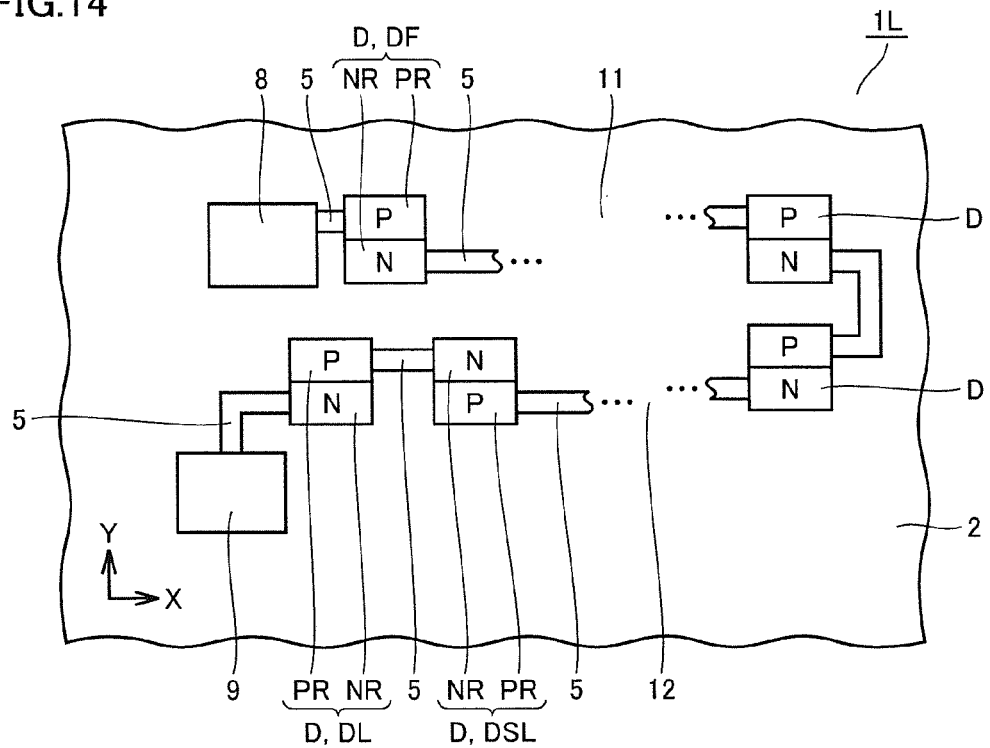
FIG. 14 is a partial plan view illustrating an arrangement of series-connected diodes in a semiconductor device according to a third modified example of the third embodiment.

The oblique opposing arrangement is not restricted to this arrangement. In a semiconductor device 1L shown in FIG. 14, for example, the diode DL is disposed separately from the diode DF in the Y direction with some distance therebetween and is then somewhat displaced from the diode DF in the X direction (a third modified example of the third embodiment).

In the semiconductor device 1L with this oblique opposing arrangement, the N-type region NR and the P-type region PR of the diodes DF and DL and the N-type region NR and the P-type region PR of the diodes DF and DSL are arranged such that the diodes DF and DL and the diodes DF and DSL are not positioned in the forward direction. As a result, the possibility that the diodes D will be damaged or malfunction by electrostatic discharge can be reduced.

In the above-described semiconductor devices 1G, 1H, and 1K, as the oblique opposing arrangement of the diodes DF and DL, the diode DSL, which is the second last diode, is disposed separately from the first diode DF with some distance therebetween in the Y direction (the diode DL is displaced from the diode DF by one diode).

As the oblique opposing arrangement of the diodes DF and DL, the third last diode (not shown) may be disposed separately from the first diode DF with some distance therebetween in the Y direction (the diode DL is displaced from the diode DF by two diodes). In this case, it is preferable that the diode DF and the third last diode be arranged in a manner other than the arrangement (forward direction) in which the P-type region of the diode DF and the N-type region of the third last diode directly oppose each other as viewed in a planar direction.

Fourth Embodiment

The positional relationship between the first diode counted from the input terminal and the diode positioned closest to the first diode will be discussed below. The diode positioned closest to the first diode is a diode other than the last diode counted from the input terminal.

Figure 15:
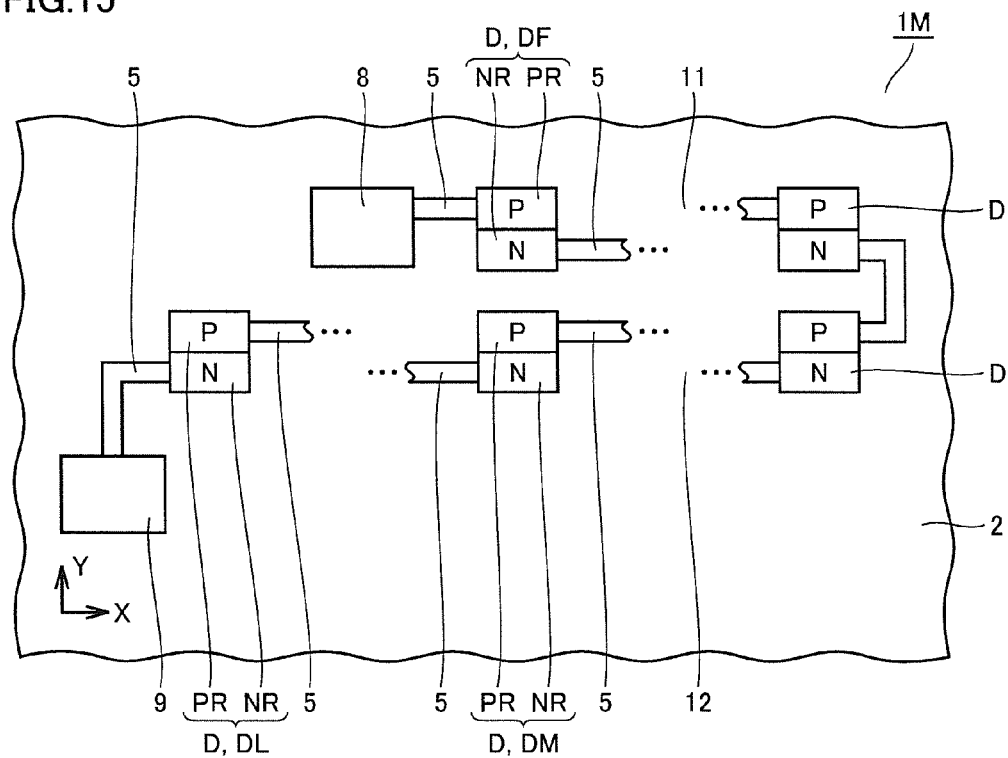
FIG. 15 is a partial plan view illustrating an arrangement of series-connected diodes in a semiconductor device according to a fourth embodiment of the present disclosure.

As shown in FIG. 15, in a semiconductor device 1M, a diode DM, which is the k-th diode (other than the last diode) counted from the input terminal 8, is positioned closest to the diode DF. The diode DM is disposed separately from the diode DF with some distance therebetween in the Y direction substantially perpendicular to the X direction. Concerning the diodes DF and DM, the N-type region NR of the diode DF and the P-type region PR of the diode DM directly oppose each other as viewed in a planar direction. The configuration of the portions other than this portion is similar to that of the semiconductor device 1 shown in FIG. 1. Thus, the same elements as those shown in FIG. 1 are designated by like reference numerals, and an explanation thereof will not be repeated unless it is necessary.

In the above-described semiconductor device 1M, concerning the diode DF to which the highest voltage is applied and the diode DM positioned closest to the diode DF, the N-type region NR of the diode DF and the P-type region PR of the diode DM directly oppose each other as viewed in a planar direction.

With this configuration, when a voltage of about several hundreds of volts is applied to the input terminal 8, a current leakage from the diode DF to the diode DM is less likely to occur than in the arrangement in which the voltage is applied between the diodes DF and DM in the forward direction, such as in the above-described semiconductor device (see FIGS. 3 and 4) of the comparative example. As a result, the possibility that the diodes D will be damaged or malfunction by electrostatic discharge can be reduced.

In the above-described semiconductor device 1M, too, the number of turnaround patterns is not restricted to one. Depending on the relationship with the pattern of another semiconductor element (not shown), for example, plural turnaround patterns may be provided. This enhances the flexibility regarding the region (pattern) in which the diodes D used as ESD protection elements are disposed, thereby contributing to finer design rules of the semiconductor device 1M.

First Modified Example of Fourth Embodiment

Concerning the arrangement of the N-type region NR and P-type region PR of the diodes DF and DM, a first modified example will be described below.

Figure 16:
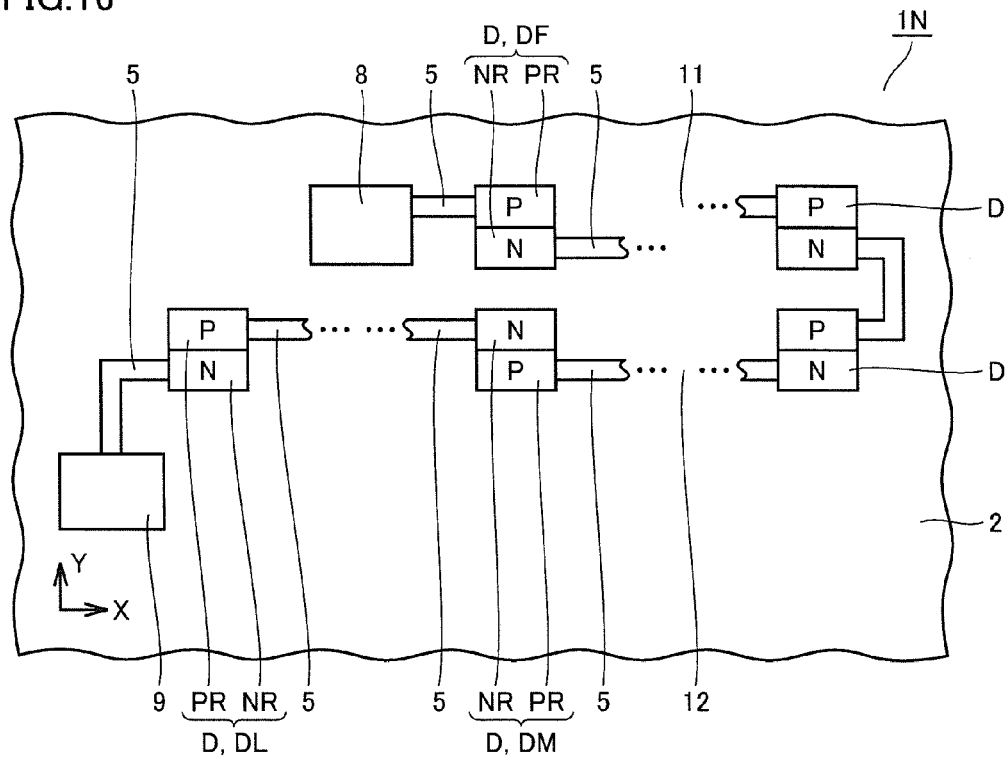
FIG. 16 is a partial plan view illustrating an arrangement of series-connected diodes in a semiconductor device according to a first modified example of the fourth embodiment.

As shown in FIG. 16, in a semiconductor device 1N of the first modified example, the diodes DF and DM are disposed separately from each other with some distance therebetween in the Y direction. Concerning the diodes DF and DM, the N-type region NR of the diode DF and the N-type region NR of the diode DM directly oppose each other as viewed in a planar direction. The configuration of the portions other than this portion is similar to that of the semiconductor devices 1 and 1M shown in FIGS. 1 and 15. Thus, the same elements as those shown in FIGS. 1 and 15 are designated by like reference numerals, and an explanation thereof will not be repeated unless it is necessary.

In the above-described semiconductor device 1N, concerning the diode DF to which the highest voltage is applied and the diode DM positioned closest to the diode DF, the N-type region NR of the diode DF and the N-type region NR of the diode DM directly oppose each other as viewed in a planar direction.

With this configuration, when a voltage of about several hundreds of volts is applied to the input terminal 8, a current leakage from the diode DF to the diode DM is less likely to occur than in the arrangement in which the voltage is applied between the diodes DF and DM in the forward direction, such as in the above-described semiconductor device (see FIGS. 3 and 4) of the comparative example. As a result, the possibility that the diodes D will be damaged or malfunction by electrostatic discharge can be reduced.

Second Modified Example of Fourth Embodiment

Concerning the arrangement of the N-type region NR and P-type region PR of the diodes DF and DM, a second modified example will be described below.

Figure 17:
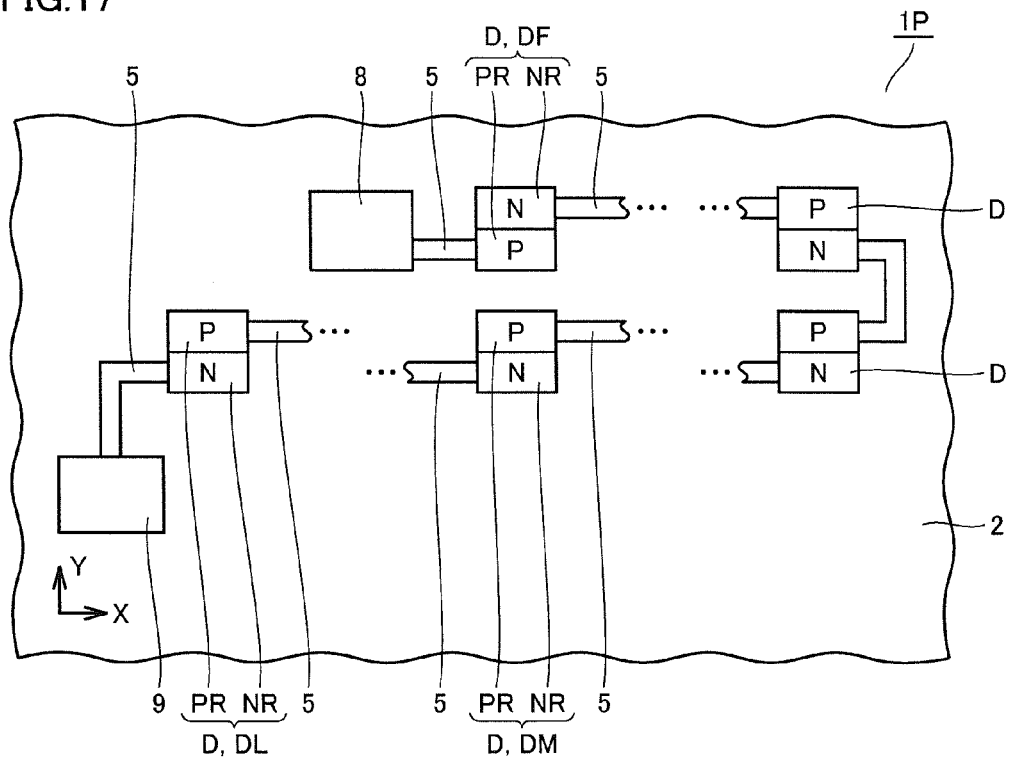
FIG. 17 is a partial plan view illustrating an arrangement of series-connected diodes in a semiconductor device according to a second modified example of the fourth embodiment.

As shown in FIG. 17, in a semiconductor device 1P of the second modified example, the diodes DF and DM are disposed separately from each other with some distance therebetween in the Y direction. Concerning the diodes DF and DM, the P-type region PR of the diode DF and the P-type region PR of the diode DM directly oppose each other as viewed in a planar direction. The configuration of the portions other than this portion is similar to that of the semiconductor devices 1 and 1M shown in FIGS. 1 and 15. Thus, the same elements as those shown in FIGS. 1 and 15 are designated by like reference numerals, and an explanation thereof will not be repeated unless it is necessary.

In the above-described semiconductor device 1P, concerning the diode DF to which the highest voltage is applied and the diode DM positioned closest to the diode DF, the P-type region PR of the diode DF and the P-type region PR of the diode DM directly oppose each other as viewed in a planar direction.

With this configuration, when a voltage of about several hundreds of volts is applied to the input terminal 8, a current leakage from the diode DF to the diode DM is less likely to occur than in the arrangement in which the voltage is applied between the diodes DF and DM in the forward direction, such as in the above-described semiconductor device (see FIGS. 3 and 4) of the comparative example. As a result, the possibility that the diodes D will be damaged or malfunction by electrostatic discharge can be reduced.

In the semiconductor devices 1N and 1P of the first and second modified examples of the fourth embodiment, too, the number of turnaround patterns is not restricted to one. Depending on the relationship with the pattern of another semiconductor element (not shown), for example, plural turnaround patterns may be provided. This enhances the flexibility regarding the region (pattern) in which the diodes D used as ESD protection elements are disposed, thereby contributing to finer design rules of the semiconductor devices 1N and 1P.

Figure 18:
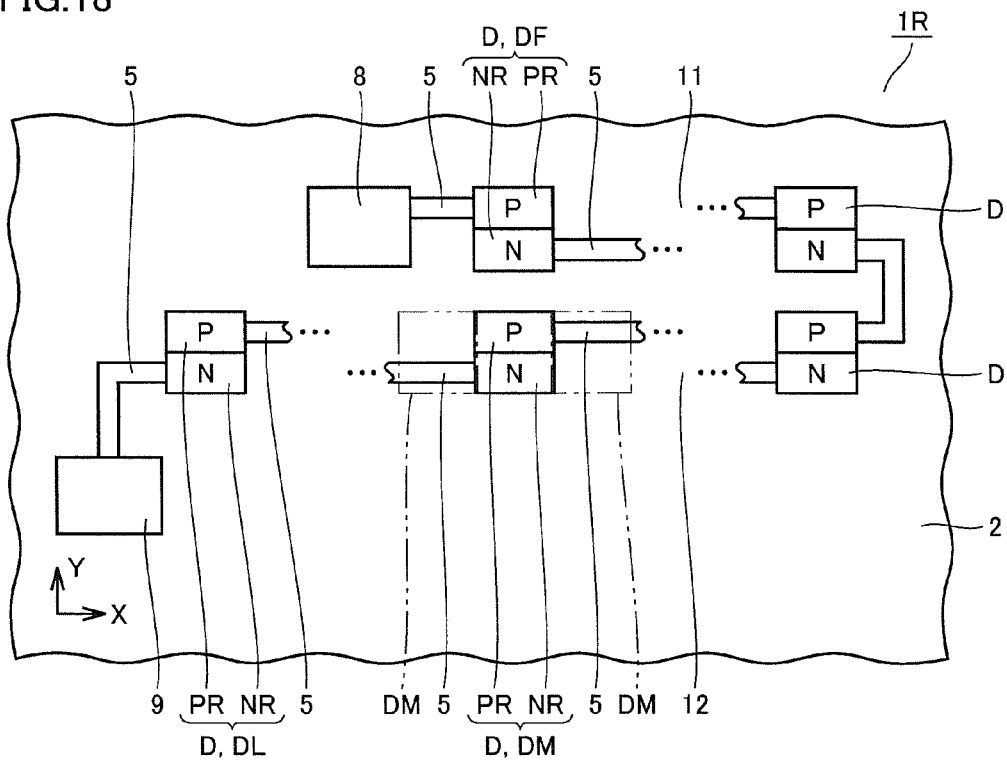
FIG. 18 is a partial plan view illustrating an arrangement of series-connected diodes in a semiconductor device according to a third modified example of the fourth embodiment.

In the arrangement of the diodes DF and DM, the diodes DF and DM are disposed separately from each other with some distance therebetween in the Y direction. However, as in a semiconductor device 1R shown in FIG. 18, the diode DM is disposed separately from the diode DF in the Y direction with some distance therebetween and is then somewhat displaced from the diode DF in the X direction (positive or negative side) (see the long dashed double-dotted lines) (a third modified example of the fourth embodiment). In the semiconductor device 1R with this opposing arrangement, too, the possibility that the diodes D will be damaged or malfunction by electrostatic discharge can be reduced.

In the semiconductor devices 1 through 1R according to the embodiments, an example of a semiconductor element protected by the diodes D is a bipolar transistor. However, any semiconductor element having a mesa structure may be used as a semiconductor element protected by the diodes D.

The disclosed embodiments have been provided only for the purposes of illustration and description. It is not intended to be exhaustive or to limit the disclosure to the precise forms disclosed. It is intended that the scope of the disclosure will be defined, not by the above-described embodiments, but by the following claims. The scope of the present disclosure is to be accorded the broadest interpretation so as to encompass all such modifications and equivalent structures and functions.

INDUSTRIAL APPLICABILITY

The present disclosure finds effective application in a semiconductor device including series-connected diodes used as ESD protection elements.

The invention claimed is:

1. A semiconductor device comprising:
a substrate having a main front surface;
an input terminal and an output terminal that are each formed on the substrate; and
a plurality of diodes that are formed on the substrate, at least one diode of the plurality of diodes constituting an electrostatic discharge protection element, and each diode of the plurality of diodes including an N-type region and a P-type region, the plurality of diodes being sequentially connected in series with each other from the input terminal and being connected to the output terminal,
wherein, in each of the plurality of diodes, the P-type region is formed so as to contact a part of the N-type region in such a manner that the N-type region and the P-type region partially overlap in a plan view,
the plurality of diodes connected in series with each other, including
  a first series-connecting portion extending from the input terminal in a first direction, a current flowing from the input terminal through the first series-connecting portion, and
  a second series-connecting portion having a section through which the current flows from the input terminal, wherein
the first series-connecting portion includes a first diode, which is the first diode counted from the input terminal,
the second series-connecting portion includes a last diode, which is the first diode counted from the output terminal,
the last diode is disposed separately from the first diode with some distance therebetween in a second direction which intersects with the first direction, and
the first diode and the last diode are arranged in a manner other than an arrangement in which the P-type region of the first diode and the N-type region of the last diode directly oppose each other in the plan view.

2. The semiconductor device according to claim 1, wherein the first diode and the last diode are arranged in such a manner that the N-type region of the first diode and the P-type region of the last diode directly oppose each other in the plan view.

3. The semiconductor device according to claim 1, wherein the first diode and the last diode are arranged in such a manner that the P-type region of the first diode and the P-type region of the last diode directly oppose each other in the plan view.

4. The semiconductor device according to claim 1, wherein the first diode and the last diode are arranged in such a manner that the N-type region of the first diode and the N-type region of the last diode directly oppose each other in the plan view.

5. The semiconductor device according to claim 1, wherein the last diode is disposed separately from the first diode with some distance therebetween in the second direction, the second direction being a direction perpendicular to the first direction.

6. The semiconductor device according to claim 1, wherein the last diode is disposed separately from the first diode with some distance therebetween in the second direction, the second direction being a direction obliquely tilting with respect to a direction perpendicular to the first direction.

7. The semiconductor device according to claim 6, wherein the last diode is disposed separately from a diode, which is the second diode counted from the input terminal, with some distance therebetween in a direction perpendicular to the first direction.

8. The semiconductor device according to claim 6, wherein the last diode is disposed in such a manner that a diode, which is the second diode counted from the output terminal, is disposed separately from the first diode in a direction perpendicular to the first direction.

* * * * *